(12) United States Patent
Zhou

(10) Patent No.: US 6,194,789 B1
(45) Date of Patent: Feb. 27, 2001

(54) FLEXIBLE HERMETIC SEALING

(75) Inventor: Ping Zhou, Phoenix, AZ (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 08/995,690

(22) Filed: Dec. 22, 1997

(51) Int. Cl.[7] .................................................. H01L 23/28
(52) U.S. Cl. .............................................. 257/790; 257/787
(58) Field of Search ................................. 257/787, 790, 257/779

(56) References Cited

U.S. PATENT DOCUMENTS 5,379,186 * 1/1995 Gold et al. ........................... 257/790

FOREIGN PATENT DOCUMENTS 60-160145 * 8/1985 (JP) ....................................... 257/790

* cited by examiner

*Primary Examiner*—Sheila V. Clark
(74) *Attorney, Agent, or Firm*—Kris T. Fredrick

(57) ABSTRACT

A flexible hermetic sealing and method for making the same. Electronic components are coated with an adhesive such as an epoxy, and then a metallic layer consisting of gold, silver, nickel, or another metal is deposited thereon. The metal may be deposited by, for example, any well-known evaporating, sputtering or plating technique. The resultant seal is truly hermetic, and is suitable for use on individual electronic or optical components on a chip.

18 Claims, 3 Drawing Sheets

FLEXIBLE HERMETIC SEALING

BACKGROUND OF THE INVENTION

1. Field of the Invention

The present invention is a flexible hermetic sealing. More particularly, this invention is a hermetic seal comprising an encapsulation and a metallic layer that is suitable for use on electronic, optic or opto-electronic hybrid devices.

2. Description of the Prior Art

Electronic components such as transistors, diodes and integrated circuit chips are well known in the prior art. Frequently, these electronic components are formed on a substrate of semi-conducting material such as a silicon or gallium arsenic wafer. Well-known components such as laser diodes and integrated optic chips may also be formed on semi-conducting substrates. Often, optical and electronics components are combined onto a single substrate to reduce cost and simplify manufacturing. These opto-electronic components are especially common in communications systems and in sensing systems such as rotation sensors.

Systems including electrical, optical and opto-electronic components are frequently utilized in industrial and aviation controls. Often, industrial and aviation environments include dust, moisture, industrial chemicals and other contaminants. All of these effects can affect the performance of electronic, optical and opto-electronic components. Moisture, for example, may be absorbed into a component substrate. At low temperatures the moisture absorbed can condense on the surface of a component die and subsequently freeze. The expansion of the water into ice could damage the component or seriously affect component performance. Similarly, corrosive materials, dust or other environmental impurities could impair component performance, or even cause the component to fail. Therefore, it is frequently desirable to isolate the components from environmental effects.

A number of component sealing methods are known in the prior art. Most commonly, the components are protected by coating the chip's surface with a thin dielectric coating such as silicon nitride. This coating isolates the components from many adverse affects, but has several weaknesses. First, the dielectric coating is incapable of providing a truly hermetic seal, since it is very difficult to apply to the sides of dies. Gaps may occur in the coating, components may come into contact with moisture and impurities that penetrate the coating through the gaps. Another disadvantage of the dielectric coating is the coating material has a different thermal expansion coefficient than the substrate to which it is applied. As the two substances expand or contract with changes in temperature, the different rates of expansion could cause cracks to appear in the coating. These cracks could allow moisture to penetrate the chips. Moreover, the protection of a dielectric coating is "chip-level", or applied to an entire chip. This style of coating is particularly difficult to apply to multiple fiber or multi-array fiber optic systems, which require many fiber connections within a particular component.

Several types of hermetic seals are well-known in the prior art. For example, U.S. Pat. No. 5,262,364 issued to Richard Brow and Larry Kovacic on Nov. 16, 1993 describes a hermetic seal comprising a metallic cover on a glass seal. Other methods of hermetic sealing include fabricating a solid weld around the package, sealing the package in glass, and sealing the package in solder. Each of these sealing methods, however, is very rigid. Stresses applied to optical connections, for example, that are sealed by any of these techniques could damage or break the fiber connections. Additionally, thermal expansion or contraction could cause rigid coatings to crack or break.

From the above description, it should be readily apparent that there is needed a flexible sealing for electrical, optical and opto-electrical components that is capable of forming a hermetic component level seal.

SUMMARY OF THE INVENTION

It is an object of the present invention to provide a hermetic sealing for electrical, optical and opto-electrical components.

It is a further object of this invention to provide a hermetic seal that is flexible.

It is a third object of this invention to provide a hermetic seal that is suitable for use in multiple fiber arrays.

It is a fourth object of this invention to provide a hermetic seal that is capable of protecting individual components within a package.

It is a fifth object of this invention to provide a method of fabricating hermetic seals incorporating the above-described properties.

According to this invention, there is provided a hermetic sealing that comprises at least one adhesive layer and at least one metallic layer. Individual components are coated with an adhesive such as an epoxy, which may be selected to have certain moisture-resistant characteristics. A metallic layer is then deposited or plated on top of the adhesive in order to complete the hermetic seal. In the preferred embodiment, a second adhesive can be placed on top of the metallic layer to resist scratching. The resulting seal is suitable for use on individual components within a chip, and is useful on any chip geometry.

The above and other objects, features, and advantages of the present invention will become apparent from the following detailed description of illustrative embodiments thereof to be read in conjunction with the accompanying drawings, in which like reference numerals are used to identify the same or similar parts in the similar views.

DETAILED DESCRIPTION OF THE PREFERRED EMBODIMENT

For purposes of illustration, the hermetic sealing is specifically described herein as being used to implement a fiber optic system. However, the sealing can also be used to implement a variety of other systems that require flexibility, component-level sealing and a truly hermetic seal. For example, the sealing could be used in electrical or electronic systems. Additionally, the sealing could be used in many types of optical or electro-optical systems. Such systems could include communications systems or rotation sensors such as fiber optics gyroscopes.

Figure 1:
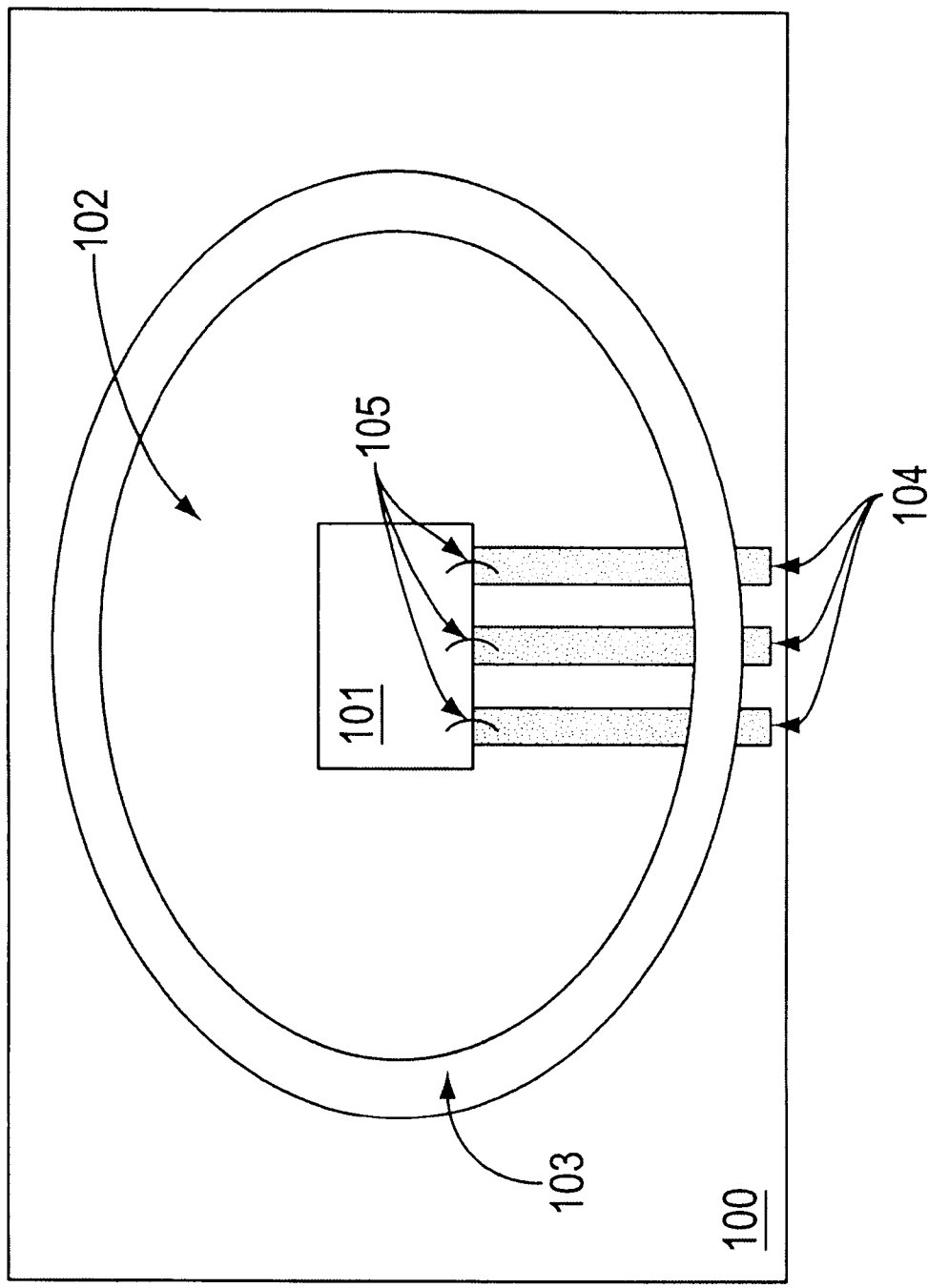
FIG. 1 is a top-down view of a component that is hermetically sealed.

Referring to FIG. 1, a component 101 (also referred to as a die) is shown on a substrate 100. Component 101 is described herein as an optical component such as a laser light source or a fiber optic cable. Alternatively, component 101 could be an electronics chip or an opto-electronic device. The substrate 100 could be fashioned from any well-known substrate material such as glass, silicon, ceramic, plastic or printed circuit board.

Surrounding component 101 is a dielectric insulating layer 103 that protects component 101 against shorting. Common dielectric materials include various combinations of silicon nitride or glass, but one skilled in the art would understand that any well-known dielectric material could be used. In the preferred embodiment of the invention, dielectric layer 103 is deposited on substrate 100 in a manner that completely surrounds component 101. If multiple components are attached on a substrate, each component could be surrounded by its own dielectric layer, or a single dielectric layer could surround multiple components on substrate 100.

Frequently, components must communicate with other components or must receive optical or electrical signals from outside the sealed region. To facilitate such communication, single or multiple leads 104 can extend through dielectric layer 103. These leads 104 may be strips of metal if component. 101 is an electronic component, or the leads 104 may be fiber optic cables if component 101 is an optical device. In some embodiments, component 101 may communicate with one or more leads through one or more contact wires.

After dielectric layer 103 is formed, a sealing layer 102 is formed to encapsulate component 101. The first layer of the seal is made up of an adhesive that is deposited so as to fill in around the dielectric layer(s) 103 and to completely enclose the surrounded components 101. The adhesive may be an epoxy, or any other type of well-known adhesive material. The particular type of epoxy selected is dependent upon the type of component 101 enclosed. If photonics components are to be sealed, a compound optical grade adhesive with moisture resistance such as a high temperature epoxy should be used. For electronics components, any moisture resistant chip encapsulant such as polymide could be used, as could any other common epoxy or adhesive. In the preferred embodiment of the invention, the epoxy should be resistant to moisture. However, the epoxy need not be hermetic in itself.

Even after the epoxy layer is deposited on the dielectric layer 103 and component 101, the seal will not be hermetic. To achieve true hermeticity, one or more layers of metal are deposited on top of the epoxy. Any deposition method such as e-beam evaporation, thermal evaporation or sputtering could be used to deposit the metal layers on the epoxy. Alternatively, the layers could be electroplated onto the adhesive. Any metal or combination of metals could be used to form the metallic layer. Metals that have shown in practice to be useful include chromium (Cr), gold (Au), nickel (Ni) and silver (Ag). Metallic solder could also be used.

Figure 2:
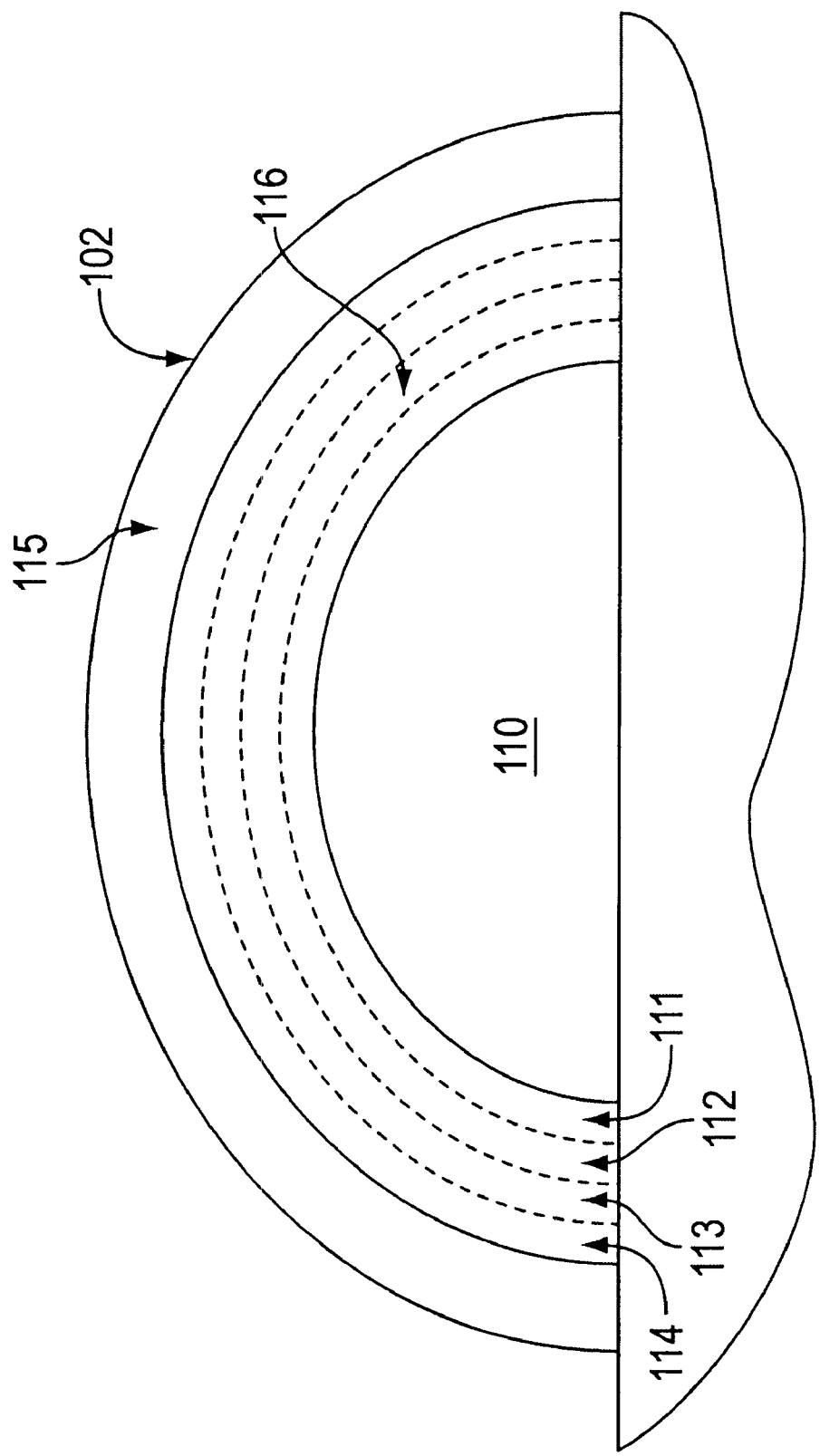
FIG. 2 is a detailed view of the sealing layer.

Although single layers of certain metals (such as gold) will provide truly hermetic seals, these seals may not be strong enough for practical use. Therefore, the preferred embodiments will use multiple layers of metals to form the sealing layer. FIG. 2 discloses a hermetic sealing layer 102 that comprises an adhesive layer 110 and a metallic layer 116 comprising several individual layers of various metals [111–114]. The first metallic layer 111 (which touches the adhesive layer 110) is made up of chromium. The second metallic layer 112 is made up of nickel, or a nickel alloy. The third layer 113 is made up of gold, and the outermost metallic layer 114 is made up of solder. Although this arrangement is found to be the preferred embodiment, hermetic seals could be fashioned from other metals or combinations of metals deposited in various permutations.

If the seal 102 is exposed to significant temperature variations, cracks due to surface tension may form. To avoid these cracks and to provide added protection against scratching, an additional protective layer 115 can be applied to the exterior of the metallic layers. This protective layer 115 can be made up of solder or adhesive such as epoxy or polymide. Although the adhesive used in the protective layer may be the same adhesive used to coat the component, different adhesives could be used. In the preferred embodiment, the external coating is selected such that it has a high glass transition temperature $T_g$.

Figure 3:
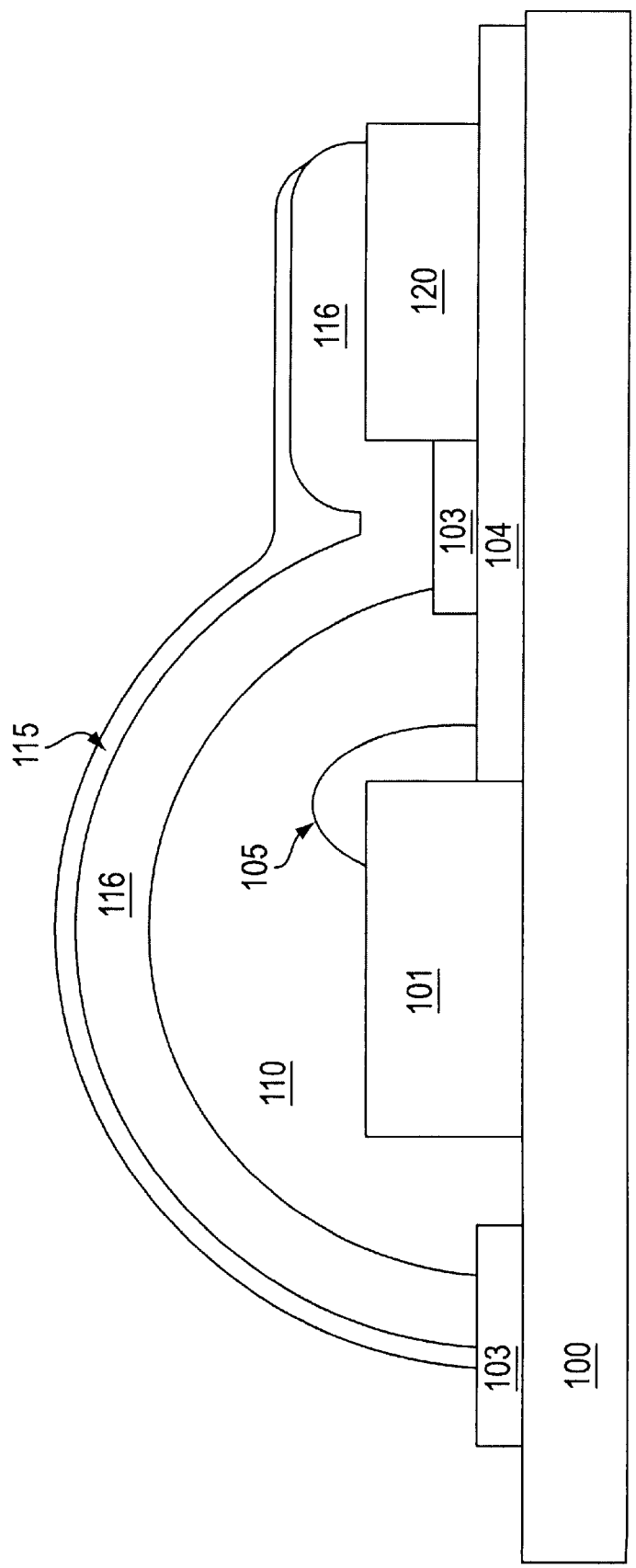
FIG. 3 is a cross-sectional view of the present invention.

FIG. 3 shows a hermetically sealed component 101 that requires at least one electrical or optical connection. As disclosed above, a component 101 is situated on a substrate 100. The component 101 is in communication with at least one lead 104, which may be an electrical contact such as a pad with a wire 105, as shown. Alternatively, the component may be in communciation via an optical fiber (not shown). In either case, the lead 104 must interface with outside signals or components. In all embodiments, a dielectric layer 103 is placed on the substrate 100 such that the leads 104 extend through the dielectric layer 103 as shown. Before the sealing layer 102 is created, a removable "lift-off" layer 120 comprised of a material such as photo-resist or tape, for example, is placed on lead 104 outside of the dielectric layer 103. After the removable layer 120 is placed, the epoxy layer 110 can again be formed in the areas surrounded by the dielectric layer, the metallic layer 116 can be deposited on top of the epoxy, dielectric layer, and contact, and any additional protective coating 115 could be applied as described above. After the metallic layer 116 is formed, removable layer 120 can be extracted to expose the leads 104. These leads can then be connected to other components, or to other means for communication.

The corresponding structures, materials, acts and equivalents of all means or step plus function elements in the claims below are intended to include any structure, material, or acts for performing the functions in combination with other claimed elements as specifically claimed. The scope of the invention should be determined by the appended claims and their legal equivalents, rather than by the examples given.

What is claimed is:

1. A seal protecting a component on a substrate, the seal comprising:

a dielectric layer enclosing an area of the substrate around the component;

an adhesive enclosing the component and the area of the substrate; and a metallic layer formed upon the adhesive and coupled to the substrate by the dielectric layer to create a hermetic seal around the component.

2. The seal of claim 1, wherein the adhesive comprises an optical grade adhesive.

3. The seal of claim 1, further comprising a protection layer coupled to the exterior of the metallic layer wherein the protection layer has a high glass transition temperature.

4. The seal of claim 1, wherein the metallic layer comprises multiple layers of metals.

5. The seal of claim 1, wherein the metallic layer comprises:

a first layer comprising at least one of chromium, gold, nickel, silver, or solder proximate to the adhesive; and a second layer proximate to the first layer comprising at least one of chromium, gold, nickel, silver, or solder.

6. The seal of claim 5, further comprising:

a third layer proximate to the second layer comprising at least one of chromium, gold, nickel, silver, or solder; and a fourth layer proximate to the third layer comprising at least one of chromium, gold, nickel, silver, or solder.

7. The seal of claim 6, wherein:

the first metallic layer comprises chromium;

the second metallic layer comprises nickel;

the third metallic layer comprises gold; and the fourth metallic layer comprises solder.

8. The seal of claim 7, further comprising a protection layer coupled to the metallic layer.

9. The seal of claim 8, wherein the protection layer has a high glass transition temperature.

10. The seal of claim 1, further comprising a lift-off layer coupled between the dielectric layer and the adhesive, wherein the lift-off layer is configured to provide communication to other components.

11. The seal of claim 8, further comprising a protection layer coupled to the metallic layer, and wherein the metallic layer comprises at least one of chromium, gold, nickel, silver, or solder.

12. The seal of claim 11, further comprising a lift-off layer coupled between the dielectric layer and the adhesive, wherein the lift-off layer is configured to provide communication to other components.

13. The seal of claim 1, wherein the metallic layer comprises at least one of chromium, gold, nickel, silver, or solder.

14. A seal protecting a component on a substrate, the seal comprising:

a dielectric layer enclosing an area of the substrate around the component;

an adhesive enclosing the component and the area of the substrate, wherein the adhesive comprises an optical grade adhesive;

a metallic layer formed upon the adhesive and coupled to the substrate by the dielectric layer to create a hermetic seal around the component; and a protection layer coupled to the exterior of the metallic layer, wherein the protection layer comprises at least one of solder, epoxy, adhesive, or polymide.

15. The seal of claim 14, wherein the metallic layer comprises:

a first layer comprising of at least one of chromium, gold, nickel, silver, or solder; and a second layer proximate to the first layer comprising of at least one of chromium, gold, nickel, silver, or solder.

16. The seal of claim 15, further comprising:

a third layer proximate to the second layer comprising of at least one of chromium, gold, nickel, silver, or solder.

17. The seal of claim 16, further comprising:

a fourth layer proximate to the third layer comprising of at least one of chromium, gold, nickel, silver, or solder.

18. The seal of claim 17, wherein:

the first metallic layer comprises chromium;

the second metallic layer comprises nickel;

the third metallic layer comprises gold; and the fourth metallic layer comprises solder.

* * * * *